(12) United States Patent
Dhuse et al.

(10) Patent No.: US 10,871,905 B2
(45) Date of Patent: *Dec. 22, 2020

(54) EXTRA WRITE SCALING FOR PERFORMANCE AND RELIABILITY

(71) Applicant: International Business Machines Corporation, Armonk, NY (US)

(72) Inventors: Greg R. Dhuse, Chicago, IL (US); Jason K. Resch, Chicago, IL (US); Ethan S. Wozniak, Park Ridge, IL (US)

(73) Assignee: PURE STORAGE, INC., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/255,986

(22) Filed: Jan. 24, 2019

(65) Prior Publication Data

US 2019/0155525 A1 May 23, 2019

Related U.S. Application Data

(63) Continuation of application No. 15/248,939, filed on Aug. 26, 2016, now Pat. No. 10,241,692.
(Continued)

(51) Int. Cl.
*G06F 3/06* (2006.01)
*G06F 11/30* (2006.01)
(Continued)

(52) U.S. Cl.
CPC ........... *G06F 3/0619* (2013.01); *G06F 3/061* (2013.01); *G06F 3/064* (2013.01); *G06F 3/067* (2013.01);
(Continued)

(58) Field of Classification Search
None
See application file for complete search history.

(56) References Cited

U.S. PATENT DOCUMENTS 4,092,732 A 5/1978 Ouchi
5,454,101 A 9/1995 Mackay et al.
(Continued)

OTHER PUBLICATIONS

Chung; An Automatic Data Segmentation Method for 3D Measured Data Points; National Taiwan University; pp. 1-8; 1998.
(Continued)

*Primary Examiner* — Pierre Miche Bataille
*Assistant Examiner* — Ryan Dare
(74) *Attorney, Agent, or Firm* — Garlick & Markison; Shayne X. Short

(57) ABSTRACT

A computing device includes an interface configured to interface and communicate with a dispersed storage network (DSN), a memory that stores operational instructions, and a processing module operably coupled to the interface and memory such that the processing module, when operable within the computing device based on the operational instructions, is configured to perform various operations. For example, the computing device monitors storage unit (SU)-based write transfer rates and SU-based write failure rates associated with each of the SUs for a write request of encoded data slices (EDSs) to the SUs within the DSN. The computing device generates and maintains a SU write performance distribution based on monitoring of the SU-based write transfer rates and the SU-based write failure rates and adaptively adjusts a trimmed write threshold number of EDSs and/or a target width of EDSs for write requests of sets of EDSs to the SUs within the DSN.

20 Claims, 7 Drawing Sheets

Related U.S. Application Data

(60) Provisional application No. 62/211,975, filed on Aug. 31, 2015.

(51) Int. Cl.

| | | |
|---|---|---|
| *G06F 11/34* | (2006.01) | |
| *H03M 13/37* | (2006.01) | |
| *G06F 11/10* | (2006.01) | |
| *G06F 12/14* | (2006.01) | |
| *H04L 29/08* | (2006.01) | |
| *H03M 13/15* | (2006.01) | |

(52) U.S. Cl.
CPC .......... *G06F 3/0611* (2013.01); *G06F 3/0622* (2013.01); *G06F 3/0635* (2013.01); *G06F 3/0637* (2013.01); *G06F 3/0644* (2013.01); *G06F 3/0659* (2013.01); *G06F 3/0665* (2013.01); *G06F 3/0689* (2013.01); *G06F 11/1076* (2013.01); *G06F 11/1092* (2013.01); *G06F 11/3034* (2013.01); *G06F 11/3409* (2013.01); *G06F 12/1408* (2013.01); *H03M 13/3761* (2013.01); *H04L 67/1097* (2013.01); *G06F 2212/1052* (2013.01); *H03M 13/1515* (2013.01)

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,504,802 B1 | 1/2003 | Tsukahara et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula |
| 2005/0132070 A1 | 6/2005 | Redlich et al. |
| 2005/0144382 A1 | 6/2005 | Schmisseur |
| 2005/0229069 A1 | 10/2005 | Hassner et al. |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): String Representation of Search Filters; IETF Network Working Group; RFC 4515; Jun. 2006; pp. 1-12.

Smith; Lightweight Directory Access Protocol (LDAP): Uniform Resource Locator; IETF Network Working Group; RFC 4516; Jun. 2006; pp. 1-15.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

(56) References Cited

OTHER PUBLICATIONS

Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): Directory Information Models; IETF Network Working Group; RFC 4512; Jun. 2006; pp. 1-49.
Zeilenga; Lightweight Directory Access Protocol (LDAP): Internationalized String Preparation; IETF Network Working Group; RFC 4518; Jun. 2006; pp. 1-14.
Zeilenga; Lightweight Directory Access Protocol (LDAP): String Representation of Distinguished Names; IETF Network Working Group; RFC 4514; Jun. 2006; pp. 1-15.

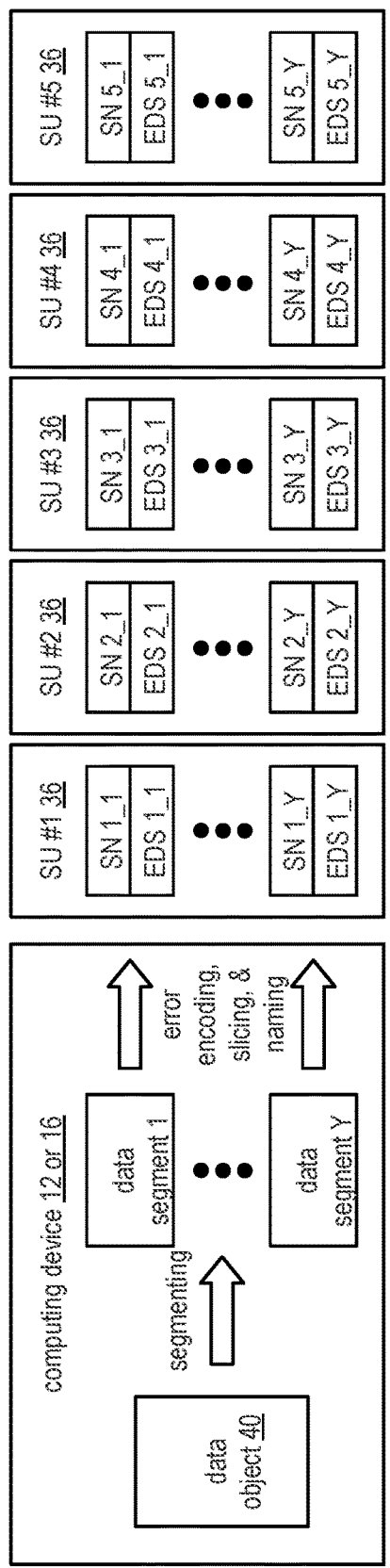
FIG. 3
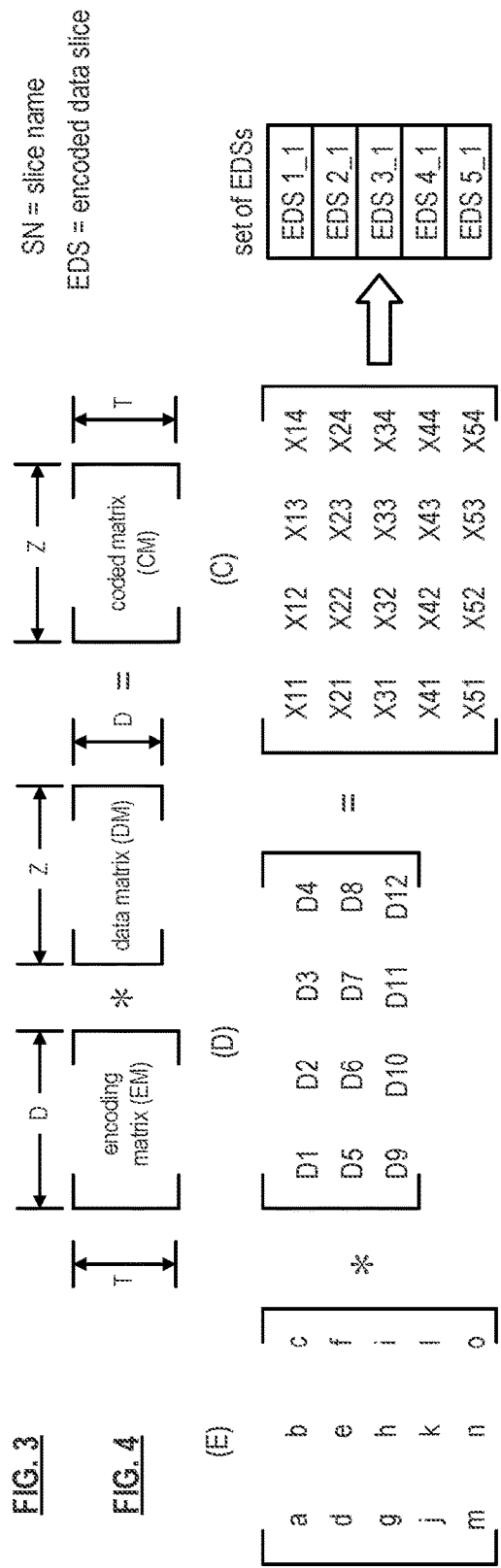
FIG. 4
FIG. 5
FIG. 6

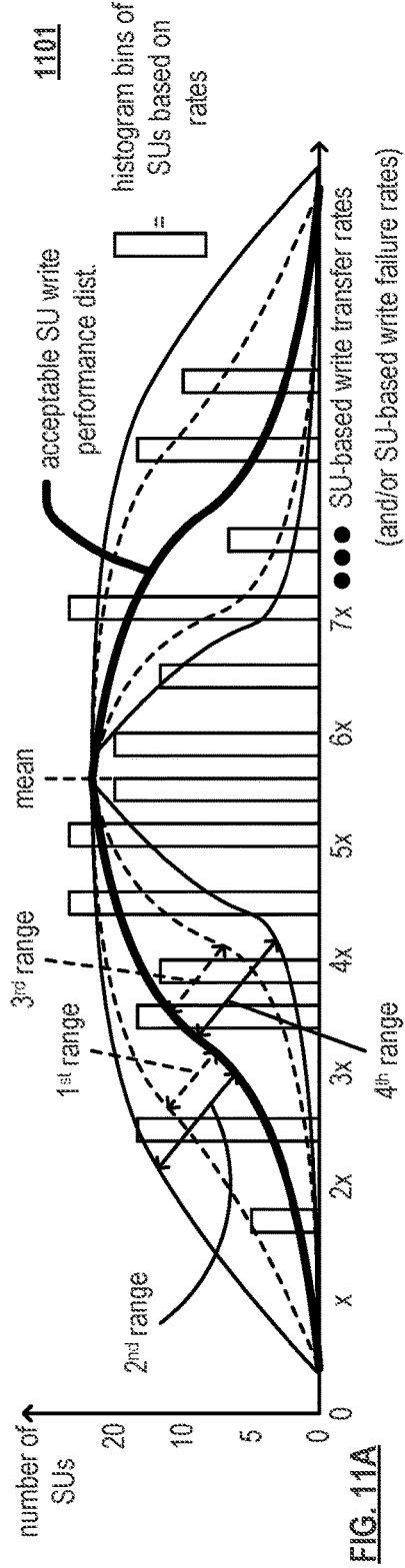
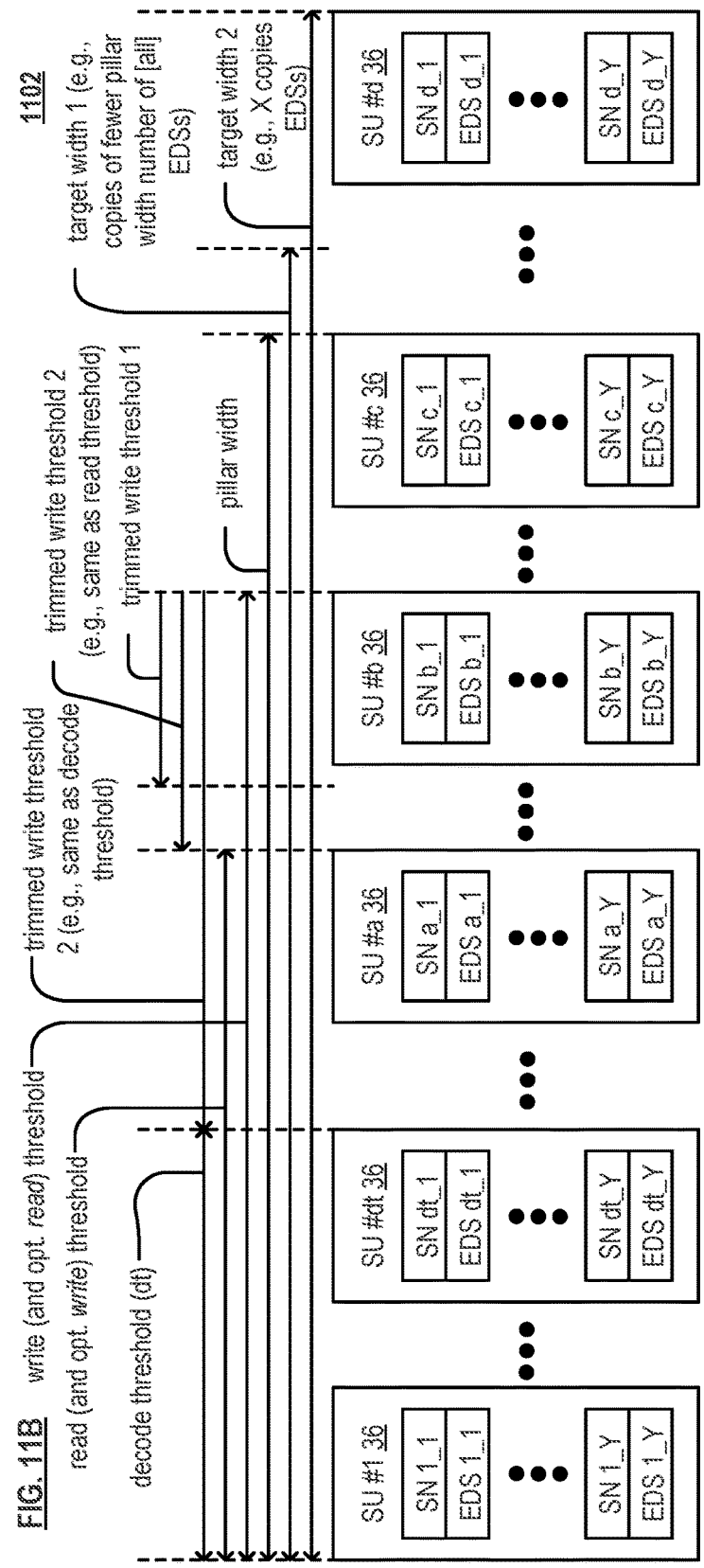

EXTRA WRITE SCALING FOR PERFORMANCE AND RELIABILITY

CROSS REFERENCE TO RELATED PATENTS

The present U.S. Utility Patent Application claims priority pursuant to 35 U.S.C. § 120 as a continuation of U.S. Utility application Ser. No. 15/248,939, entitled "EXTRA WRITE SCALING FOR PERFORMANCE AND RELIABILITY," filed Aug. 26, 2016, which claims priority pursuant to 35 U.S.C. § 119(e) to U.S. Provisional Application No. 62/211,975, entitled "STORING ENCODED DATA SLICES IN A DISPERSED STORAGE NETWORK," filed Aug. 31, 2015, both of which are hereby incorporated herein by reference in their entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Prior art data storage systems do not provide adequate means to handle variability of performance, latency, etc. while providing effective servicing to users thereof. For example, the overall network operation of a data storage system may change over time (both positively and negatively). Also, such a data storage system may experience failures that degrades the performance thereof. The prior art does not provide adequate means to maintain a high level of performance while combating such effects.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 11A is a schematic block diagram of an example of an acceptable SU write performance distribution relative to determined characteristics associated with operation of a DSN in accordance with the present invention; and FIG. 11B is a schematic block diagram of an example of various parameters associated with a set of encoded data slices (EDSs) stored within storage units (SUs) in accordance with the present invention.

DETAILED DESCRIPTION OF THE INVENTION

Figure 1:
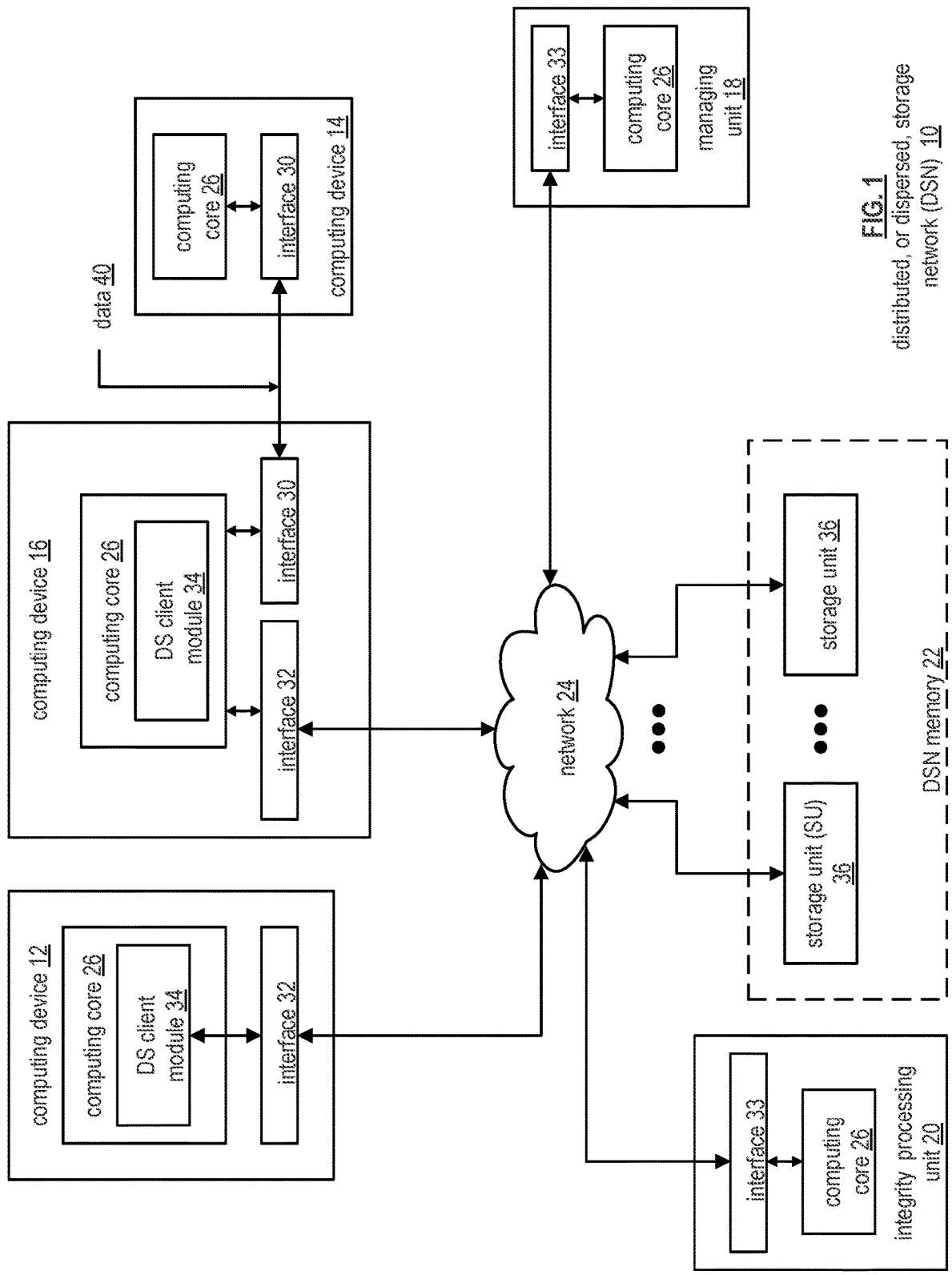
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
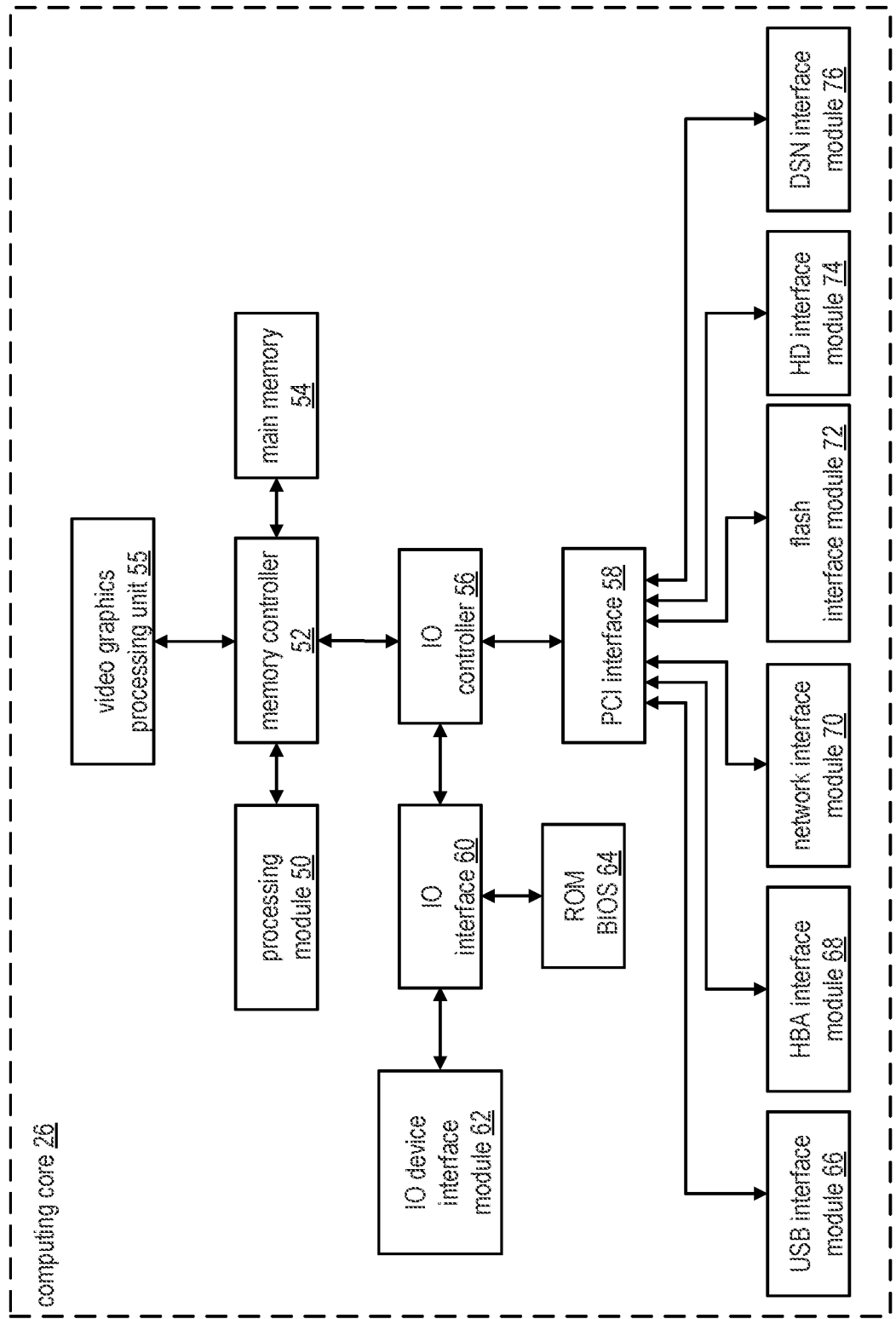
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN module 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity check-sum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
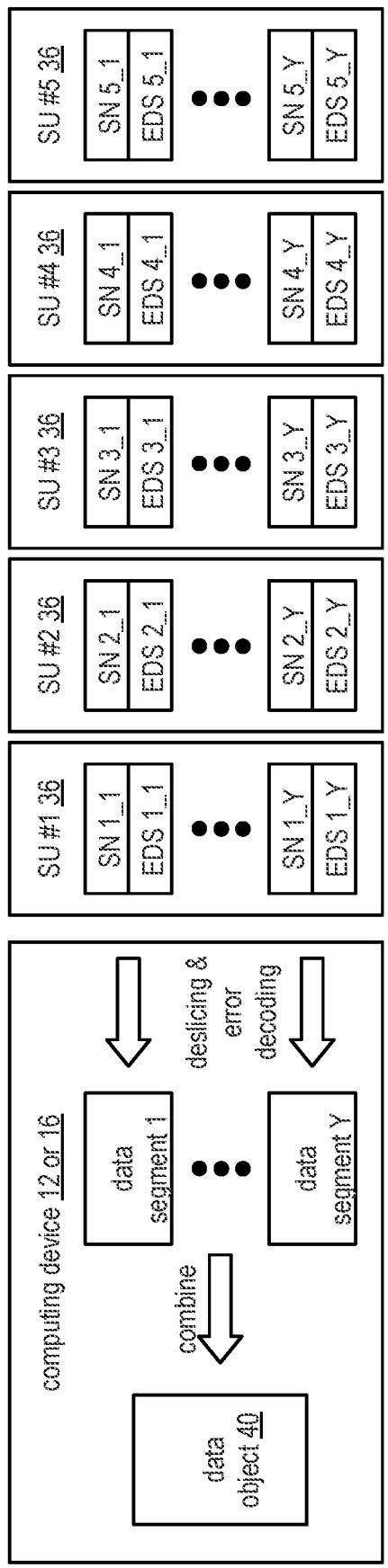
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
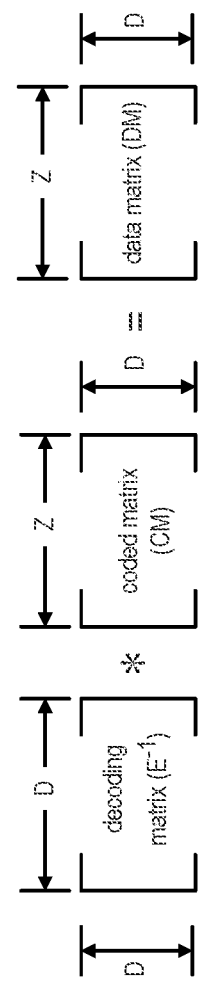
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
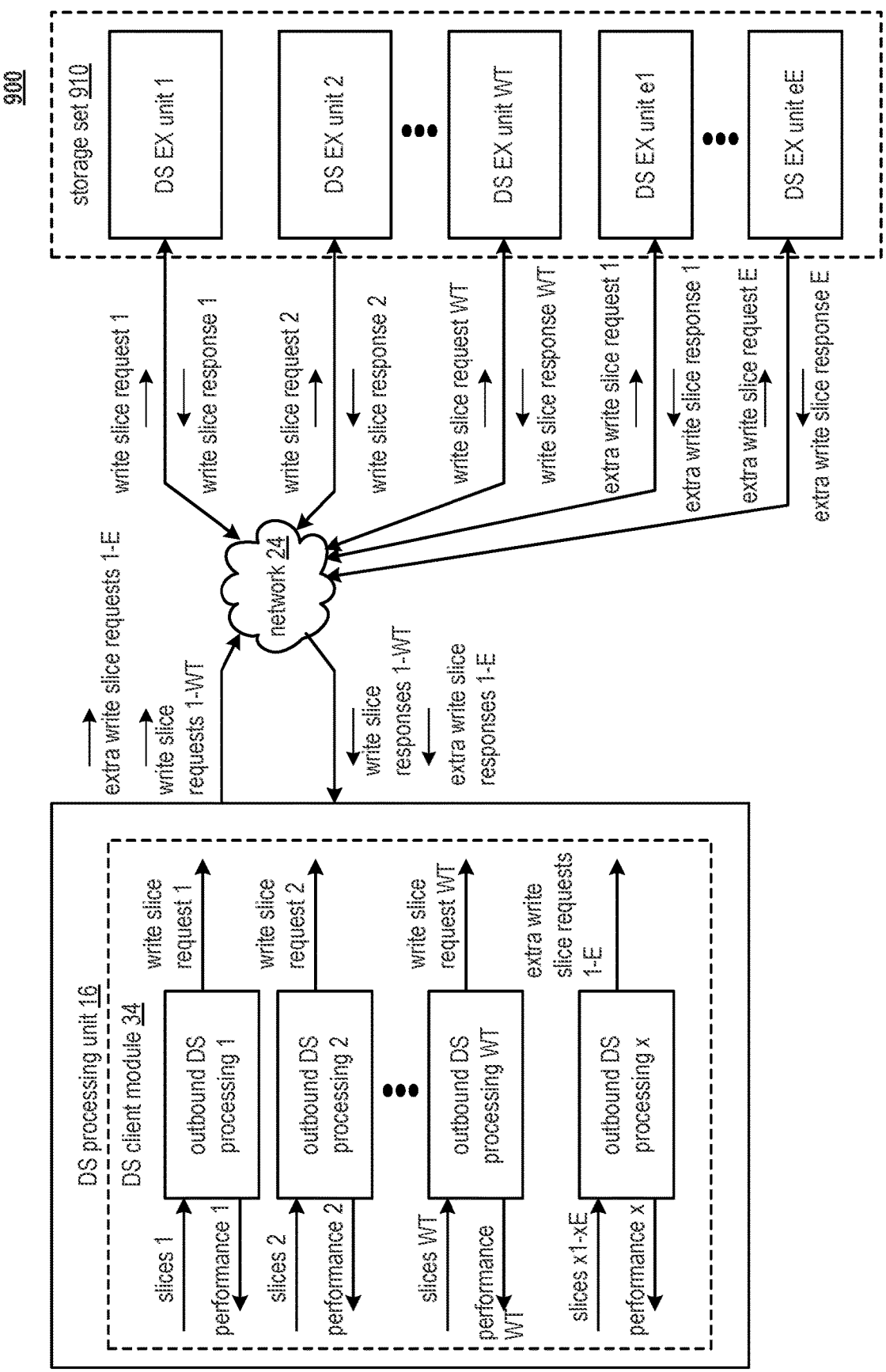
FIG. 9 is a schematic block diagram of another embodiment of a dispersed storage network (DSN) in accordance with the present invention.

FIG. 9 is a schematic block diagram of another embodiment 900 of a dispersed storage network (DSN) in accordance with the present invention. This diagram provides a is a schematic block diagram of another embodiment of a dispersed storage network (DSN) that includes the DSN processing unit (or computing device) 16 of FIG. 1, the network 24 of FIG. 1, and a storage set. The DSN processing unit (or computing device) 16 includes the DS client module 34 of FIG. 1. The DS client module 34 includes one or more outbound DS processing 1-*x*, where each outbound DS processing may be implemented utilizing the outbound DS processing 80 of FIG. 3. The storage set includes a set of DS execution (EX) units 1-WT, e1-eE, where WT=write threshold number. Each DS execution unit may be implemented utilizing the DS execution unit 36 of FIG. 1. Hereafter, each DS execution unit may be interchangeably referred to as a storage unit and the storage set may be interchangeably referred to as a set of storage units. The DSN functions to store data in the storage set.

In an example of operation of the storing of the data the DS client module 34 determines a number of extra slices E storage in the storage set when storing a data segment, where data is divided into a plurality of data segments that includes the data segment, where each data segment is dispersed storage error encoded in accordance with dispersal parameters to produce a set of encoded data slices, and where a write threshold number of encoded data slices plus E number of extra encoded data slices of the set of encoded data slices are stored in the storage set. The determining includes one or more of generating E based on one or more of a previous value of E, a historical performance level of accessing an encoded data slices via the network 24 to the set of storage units (e.g., determine performance of each outbound DS processing where each outbound DS processing provides a performance level indicator, interpret timing of receiving a write slice response), a valid range of E (e.g., 0 to n-WT), a desired level of performance (e.g., minimizing access latency), and a desired level of resource utilization (e.g., lowering network bandwidth utilization, lowering processing power usage, etc.). For example, the DS client module 34 determines to raise E to lower access latency while raising resource utilization. As another example, the DS client module 34 determines to lower E to lower resource utilization while raising access latency.

Having determined E, the DS client module 34 facilitates storage of a write threshold number of encoded data slices of the set of encoded data slices. For example, the DS client module 34 issues, via the network 24, write slice requests 1-WT to DS execution units 1-WT, where the write slice requests include encoded data slices 1-WT. When the number of extra encoded data slices E is further than zero, the DS client module 34 facilitates storage of the number of extra encoded data slices in storage units of the storage set. For example, the DS client module 34 issues, via the network 24, extra write slice requests 1-E to the DS execution units e1-eE, where the extra write slice requests include encoded data slices x1-xE (e.g., from remaining slices of n-WT, where n=an information dispersal algorithm width of the dispersal parameters.

In an example, the DS processing unit (or computing device) 16 is in communication with a storage set 910 via network 24. The DS processing unit (or computing device) 16 includes an interface configured to interface and communicate with a dispersed storage network (DSN) that includes the storage set 910 (e.g., that may include a number of SUs), memory that stores operational instructions, and a processing module operably coupled to the interface and to the memory, wherein the processing module, when operable within the computing device based on the operational instructions, is configured to perform various functions.

In an example of operation and implementation, the DS processing unit (or computing device) 16 monitors storage unit (SU)-based write transfer rates and SU-based write failure rates associated respectively with each of a storage units (SUs) (e.g., of storage set 910) for a write request of a set of encoded data slices (EDSs) to the SUs within the DSN. Note that a data object is segmented into data segments, and a data segment of the plurality of data segments is dispersed error encoded in accordance with dispersed error encoding parameters to produce the set of EDSs that is of pillar width. A decode threshold number of EDSs are needed to recover the data segment, a read threshold number of EDSs provides for reconstruction of the data segment, and a write threshold number of EDSs provides for a successful transfer of the set of EDSs from a first at least one location in the DSN to a second at least one location in the DSN.

Referring to the example of operation and implementation, the DS processing unit (or computing device) 16 generates and maintains a SU write performance distribution based on monitoring of the SU-based write transfer rates and the SU-based write failure rates. For example, the DS processing unit (or computing device) 16 can monitor the SUs and track them within a histogram (e.g., such as also described with reference to FIG. 11A) to generate the such a SU write performance distribution and for use to compare it with one or more acceptable SU write performance distributions and/or one or more ranges of favorably or unfavorably comparison of the SU write performance distribution with the one or more acceptable SU write performance distributions.

The DS processing unit (or computing device) 16 then adaptively adjusts a trimmed write threshold number of EDSs and/or a target width of EDSs for write requests of sets of EDSs to the plurality of SUs within the DSN including the write request of the set of EDSs to the plurality of SUs within the DSN based on favorable or unfavorable comparison of the SU write performance distribution to an acceptable SU write performance distribution. For example, the DS processing unit (or computing device) 16 may adaptively adjust (increase or decrease) the trimmed write threshold number of EDSs based on unfavorable comparison of the SU write performance distribution to an acceptable SU write performance distribution. The DS processing unit (or computing device) 16 may adaptively adjust (increase or decrease) the target width of EDSs for write requests of sets of EDS based on unfavorable comparison of the SU write performance distribution to an acceptable SU write performance distribution.

In some examples, the DS processing unit (or computing device) 16 operates adaptively to adjust the trimmed write threshold number of EDSs to be below the write threshold number of EDSs and greater than or equal to the decode threshold number of EDSs when the SU write performance distribution compares unfavorably to the acceptable SU write performance distribution. The DS processing unit (or computing device) 16 also operates adaptively so adjust the trimmed write threshold number of EDSs to be same as the write threshold number of EDSs when the SU write performance distribution compares favorably to the acceptable SU write performance distribution.

In even other examples, the DS processing unit (or computing device) 16 operates adaptively to adjust the trimmed write threshold number of EDSs to be a first number below the write threshold number of EDSs and greater than or equal to the decode threshold number of EDSs when the SU write performance distribution compares unfavorably to the acceptable SU write performance distribution within a first unfavorable comparison range. The DS processing unit (or computing device) 16 also operates adaptively to adjust the trimmed write threshold number of EDSs to be a second number below the write threshold number of EDSs and greater than or equal to the decode threshold number of EDSs when the SU write performance distribution compares unfavorably to the acceptable SU write performance distribution within a second unfavorable comparison range.

In other examples, the DS processing unit (or computing device) 16 operates adaptively increase the target width of EDSs to be greater than the pillar width to specify a subset number of redundant EDSs to be generated from the set of EDSs to be included in at least one write request of at least one set of EDSs to the SUs within the DSN when the SU write performance distribution compares unfavorably to the acceptable SU write performance distribution. The DS processing unit (or computing device) 16 also operates adaptively to adjust the target width of EDSs to be same as the pillar width when the SU write performance distribution compares favorably to the acceptable SU write performance distribution.

In even other examples, the DS processing unit (or computing device) 16 operates adaptively increase the target width of EDSs to be greater than the pillar width to specify a first subset number of redundant EDSs to be generated from the set of EDSs to be included in the at least one write request of the at least one set of EDSs to the SUs within the DSN when the SU write performance distribution compares unfavorably to the acceptable SU write performance distribution within a first unfavorable comparison range. The DS processing unit (or computing device) 16 also operates adaptively to increase the target width of EDSs to be greater than the pillar width to specify a second subset number of redundant EDSs to be generated from the set of EDSs to be included in the at least one write request of the at least one set of EDSs to the SUs within the DSN when the SU write performance distribution compares unfavorably to the acceptable SU write performance distribution within a second unfavorable comparison range.

In some other examples, the DS processing unit (or computing device) 16 operates adaptively to increase the target width of EDSs to be greater than the pillar width to specify one or more redundant copies of the set of EDSs to be generated from the set of EDSs to be included in at least one write request of at least one set of EDSs to the plurality of SUs within the DSN when the SU write performance distribution compares unfavorably to the acceptable SU write performance distribution and adaptively to adjust the target width of EDSs to be same as the pillar width when the SU write performance distribution compares favorably to the acceptable SU write performance distribution.

In other examples, the DS processing unit (or computing device) 16 operates to increase a time interval between write requests of sets of EDSs to the plurality of SUs within the DSN to an extended time interval when the SU write performance distribution compares unfavorably to the acceptable SU write performance distribution over a first period of time. Then, in some instances, the DS processing unit (or computing device) 16 reduces the time interval between write requests of sets of EDSs to the plurality of SUs within the DSN from the extended time interval to another extended time interval or the time interval when the SU write performance distribution compares favorably to the acceptable SU write performance distribution over a second period of time following the first period of time.

Note that the DS processing unit (or computing device) 16 may be located at a first premises that is remotely located from at least one SU of the SUs (e.g., storage set 910) within the DSN. Note also that the DS processing unit (or computing device) 16 may be any type of device described herein or their equivalent including a SU of the SUs (e.g., storage set 910) within the DSN, a wireless smart phone, a laptop, a tablet, a personal computers (PC), a work station, or a video game device. Note also that the DSN may be implemented to include or be based on any of a number of different types of communication systems including a wireless communication system, a wire lined communication systems, a non-public intranet system, a public internet system, a local area network (LAN), and/or a wide area network (WAN).

Figure 10B:
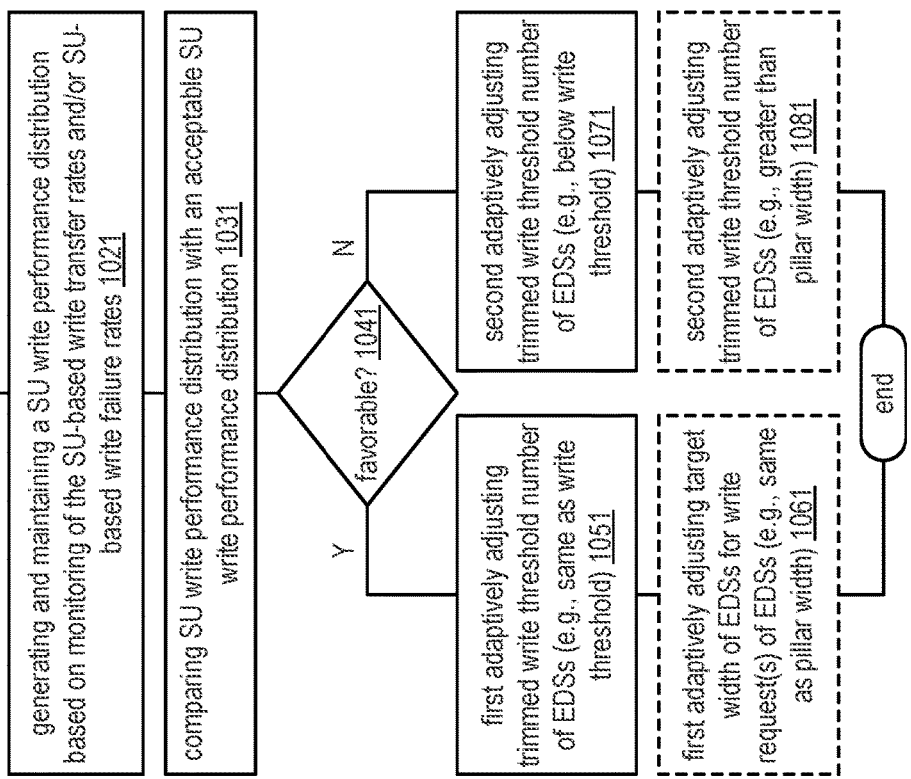
FIG. 10B is a diagram illustrating another embodiment of a method for execution by one or more computing devices in accordance with the present invention.
Figure 10A:
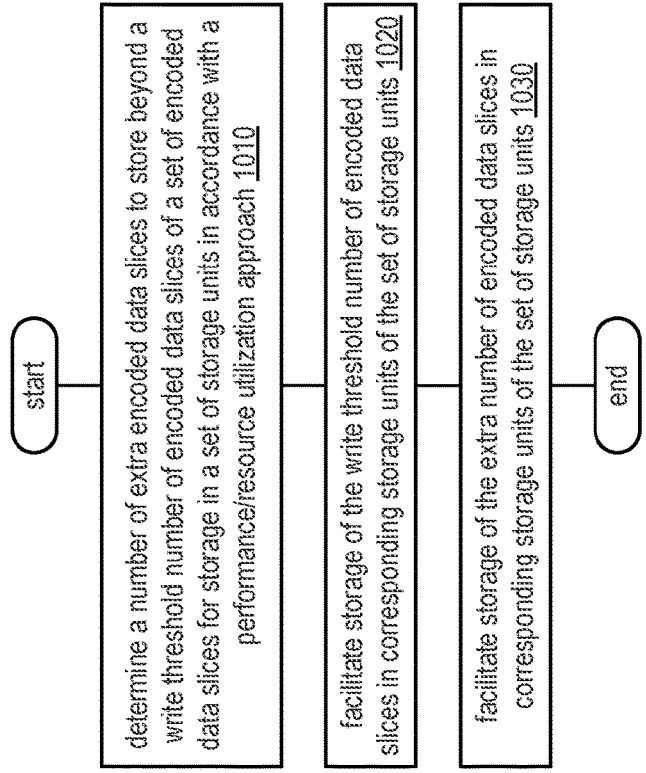
FIG. 10A is a diagram illustrating an embodiment of a method for execution by one or more computing devices in accordance with the present invention.

FIG. 10A is a diagram illustrating an embodiment of a method 1001 for execution by one or more computing devices in accordance with the present invention. This diagram depicts another example of storing data. The method begins or continues at a step 1010 where a processing module of a distributed storage and task (DS) processing unit determines a number of extra encoded data slices to store beyond a write threshold number of encoded data slices of a set of encoded data slices for storage in a set of storage units in accordance with a performance/resource utilization approach. The performance/resource utilization approach includes favoring performance at the expense of resource utilization, favoring resource utilization at the expense of performance, and striking a balance between performance and resource utilization. The determining includes generating the number based on one or more of a previous value of the number of extra encoded data slices, a historical performance level of accessing encoded data slices, a desired level of performance, and a desired resource utilization level.

The method continues at a step 1020 where the processing module facilitate storage of the write threshold number of encoded data slices in corresponding storage units of the set of storage units. For example, the processing module issues read slice requests to the corresponding storage units, where the requests include the write threshold number of encoded data slices.

The method continues at a step 1030 where the processing module facilitates storage of the extra number of encoded data slices in corresponding storage units of the set of storage units. For example, the processing module issues extra write slice requests to the corresponding storage units, where the extra requests include the extra number of encoded data slices.

FIG. 10B is a diagram illustrating another embodiment of a method 1002 for execution by one or more computing devices in accordance with the present invention. The method 1002 operates in step 1011 by monitoring storage unit (SU)-based write transfer rates and SU-based write failure rates associated respectively with each SU of a set storage units (SUs) (e.g., storage set) for a write request of a set of encoded data slices (EDSs) to the SUs within a dispersed storage network (DSN) via an interface of the computing device implemented to interface and communicate with the DSN. Note that a data object is segmented into a data segments, and a data segment of the data segments is dispersed error encoded in accordance with dispersed error encoding parameters to produce the set of EDSs that is of pillar width. A decode threshold number of EDSs are needed to recover the data segment, a read threshold number of EDSs provides for reconstruction of the data segment, and a write threshold number of EDSs provides for a successful transfer of the set of EDSs from a first at least one location in the DSN to a second at least one location in the DSN.

The method 1002 operates in step 1021 by generating and maintaining a SU write performance distribution based on monitoring of the SU-based write transfer rates and the SU-based write failure rates and by comparing the SU write performance distribution with an acceptable SU write performance distribution in step 1031.

When the SU write performance distribution compares favorably with the acceptable SU write performance distribution in step 1041, the method 1002 operates by first adaptively adjusting a trimmed write threshold number of EDSs in step 1051. In some examples, this involves making the trimmed write threshold number to be same as the write threshold. In some examples, this involves making the trimmed write threshold number to be same as the pillar width minus some desired number. If desired in optional embodiments, the method 1002 operates in optional step 1061 by first adaptively adjusting a target width of EDSs for write requests of sets of EDSs to the SUs within the DSN including the write request of the set of EDSs to the SUs within the DSN. In some examples, this involves making target width of EDSs to be same as the pillar width.

When the SU write performance distribution compares unfavorably with the acceptable SU write performance distribution in step 1041, the method 1002 operates by second adaptively adjusting the trimmed write threshold number of EDSs in step 1071. In some examples, this involves making the trimmed write threshold number to be some number below the write threshold. If desired in optional embodiments, the method 1002 operates in optional step 1081 by second adaptively adjusting the target width of EDSs for write requests of sets of EDSs to the SUs within the DSN including the write request of the set of EDSs to the SUs within the DSN. In some examples, this involves making target width of EDSs to be greater than the pillar width.

FIG. 11A is a schematic block diagram of an example 1101 of an acceptable SU write performance distribution relative to determined characteristics associated with operation of a DSN in accordance with the present invention. A DS processing unit (or computing device) operates to monitor SUs and track their performance with respect to SU-based write transfer rates and/or SU-based write failure rates. For example, the DS processing unit (or computing device) operates to monitor and track the historical operations of the SUs within the DSN and categorize the SUs within bins of a histogram based on their performance relative to or compared to an acceptable SU-based write transfer rate and/or an acceptable SU-based write failure rate. The vertical axis shows the number of SUs within each respective bin, and the horizontal axis shows numerical values associated with SU-based write transfer rates and/or SU-based write failure rates. Once such an SU write performance distribution is generated, it may be updated or maintained (e.g., periodically after elapse of certain time periods, occasionally such as based on occurrence of certain events, continuously, etc.) so that an accurate understanding of the performance of the SUs of a DSN may be known by a DS processing unit (or computing device) so that accurate decision-making may be made with respect to any potential modification, changing, etc. of one or more parameters by which operation within the DSN is to be performed.

For example, such a DS processing unit (or computing device) operates to generate and maintain a SU write performance distribution based on monitoring of the SU-based write transfer rates and the SU-based write failure rates. The DS processing unit (or computing device) then compares this SU write performance distribution to one or more acceptable SU write performance distribution (e.g., that are based on one or more an acceptable SU-based write transfer rates and/or an acceptable SU-based write failure rates) to determine how the DSN is operating. The DS processing unit (or computing device) may then operate adaptively to adjust a trimmed write threshold number of EDSs and/or a target width of EDSs for write requests of sets of EDSs to the SUs within the DSN based on favorable (or unfavorable) comparison of the SU write performance distribution to an acceptable SU write performance distribution.

In some examples, such a DS processing unit (or computing device) generates a histogram based on performance of the SUs based on such considerations and can then generate such a SU write performance distribution for use to compare it with one or more acceptable SU write performance distributions and/or one or more ranges of favorably or unfavorably comparison of the SU write performance distribution with the one or more acceptable SU write performance distributions. For example, when the SU write performance distribution compares unfavorably with an SU write performance distribution within a first unfavorable comparison range, the DS processing unit (or computing device) adaptively adjusts the trimmed write threshold number of EDSs to be a first number below the write threshold number of EDSs and greater than or equal to the decode threshold number of EDSs. Alternatively, when the SU write performance distribution compares unfavorably with the SU write performance distribution within a second unfavorable comparison range, the DS processing unit (or computing device) adaptively adjusts the trimmed write threshold number of EDSs to be a second number below the write threshold number of EDSs and greater than or equal to the decode threshold number of EDSs. In general, a reduction of the trimmed write threshold number of EDSs may correspond to a reduction in the number of EDSs that may be used to provide for a successful transfer of the set of EDSs from a first at least one location in the DSN to a second at least one location in the DSN. For example, instead of requiring the write threshold number of EDSs to provide for the successful transfer of the set of EDSs from a first at least one location in the DSN to a second at least one location in the DSN, fewer than the write threshold number of EDSs (e.g., trimmed write threshold number of EDSs) may be used to provide successful transfer of the set of EDSs from a first at least one location in the DSN to a second at least one location in the DSN. For example, the DS processing unit (or computing device) determines, for one or more various considerations, that fewer than the full write threshold number of EDSs (e.g., trimmed write threshold number of EDSs) may be used to provide successful transfer of the set of EDSs from a first at least one location in the DSN to a second at least one location in the DSN. As an example, when the SU write performance distribution compares unfavorably to an acceptable SU write performance distribution, then fewer than the full write threshold number of EDSs may be used and still be deemed to provide for a successful write operation of EDSs.

Also, in some examples, when the SU write performance distribution compares unfavorably with an SU write performance distribution within a first unfavorable comparison range, the DS processing unit (or computing device) adaptively increases the target width of EDSs to be greater than the pillar width to specify a subset number of redundant EDSs to be generated from the set of EDSs to be included in at least one write request of at least one set of EDSs to the plurality of SUs within the DSN. Alternatively, when the SU write performance distribution compares unfavorably with the SU write performance distribution within a second unfavorable comparison range, the DS processing unit (or computing device) adaptively increases the target width of EDSs to be greater than the pillar width. In general, an increase of the target width may correspond to generation of a number of redundant copies of EDSs that may be retrieved and used to service users of the DSN.

FIG. 11B is a schematic block diagram of an example 1102 of various parameters associated with a set of encoded data slices (EDSs) stored within storage units (SUs) in accordance with the present invention. This diagram shows generally the relationship between a pillar width number of SUs (and/or EDSs), a decode threshold number of SUs (and/or EDSs), a read threshold number of SUs (and/or EDSs), and a write threshold number of SUs (and/or EDSs). When considering such numbers with respect to EDSs, note that a data object is segmented into data segments, and a data segment of the plurality of data segments is dispersed error encoded in accordance with dispersed error encoding parameters to produce the set of EDSs that is of pillar width. A decode threshold number of EDSs are needed to recover the data segment, a read threshold number of EDSs provides for reconstruction of the data segment, and a write threshold number of EDSs provides for a successful transfer of the set of EDSs from a first at least one location in the DSN to a second at least one location in the DSN. Note also that the read threshold number and the write threshold number may be the same in certain examples and based on certain dispersed error encoding parameters. In general, the read threshold number is greater than the decode threshold number. Also, the write threshold number is generally greater than the read threshold number and less than the pillar width.

A trimmed write threshold EDSs and/or a target width number of EDSs may be understood with respect to certain examples based on the various values shown in this diagram. For example, a trimmed write threshold number of EDSs may be viewed as allowing fewer than a full write threshold number of EDSs to provide for a successful write operation of EDSs. Note that different respective values of a trimmed write threshold number of EDSs may be used at different times and based on different considerations. In various examples, the trimmed write threshold number of EDSs may correspond to the decode threshold number of EDSs, the read threshold number of EDSs, and/or any other value as desired with reference to the various parameters associated with such dispersed error encoding parameters.

In addition, a target width that is greater than the pillar width may be used to generate redundant copies of the EDSs. In one example, a target width 1 corresponds to generating redundant copies of EDSs that is fewer than the pillar width of EDSs. For example, copies of a subset of the EDSs within the pillar width number of EDSs are made for use to service the DSN. Alternatively, a target width 2 corresponds to generating an integer multiple number of redundant copies of those EDSs that are within the pillar width of EDSs (e.g., one redundant copy of those EDSs, two redundant copies of those EDSs, three two redundant copies of those EDSs, etc.).

Note also that any desired values of trimmed write threshold number of EDSs and/or target width may be adapted, modified, adjusted, etc. to be any of the various numbers as described with respect to this diagram at different times and based on different considerations.

This disclosure presents various embodiments, examples, etc. that may be used to provide for scaling of the number write operations within a DSN to provide for improved performance and capability. Various parameters associated with the dispersed error encoding parameters may be adapted, modified, etc. based on various considerations including SU-based write transfer rates and/or the SU-based write failure rates. For example, when using write strategies that have multiple options for storage locations (e.g., trimmed writes or target widths), there may be situations where a DS processing unit (or computing device) may unfortunately experience an unexpectedly high latency for at least one of the write requests, or alternatively encounter a write request failure.

In an example, when this happens and only a write threshold number of EDSs are written, this may trigger either a high latency (waiting for the slowest of the issued requests to complete) or the failure will trigger a resistance of new write requests (thereby doubling the latency). To prevent unexpectedly high latency events, a DS processing unit (or computing device) may operate by using a feature known as write extra that will issue some additional number of write requests (e.g., E) in excess of the minimum write threshold. In an example, when E is 2, the DS processing unit (or computing device) can tolerate 2 failures without having to reissue additional write requests, as well as two unexpectedly slow DS processing units (or computing devices) without decreasing latency of the operation. Note that there may be an additional cost for such extra write operation in some DSNs (e.g., terms of network input/output (TO), storage TO, and TOPS). If desired in some examples, to balance the tradeoffs of request latency and bandwidth/throughput, the DS processing unit (or computing device) monitors the distribution pattern of latency across the SUs (e.g., such a SU-based write transfer rates and/or SU-based write failure rates), and may also monitor the historical error rate. When the DS processing unit (or computing device) determines there is a cost/benefit motivation to use excess bandwidth/IO/TOPS to improve or reach a latency target, the DS processing unit (or computing device) will increase the number of extra slices (e.g., generate some redundant number of EDSs) and re-evaluate. Alternatively, if the DS processing unit (or computing device) determines that the motivation is in the opposite direction, then to improve bandwidth/IO/IOPS, the DS processing unit (or computing device) may alternatively decrease the number of extra slices (e.g., with a lower bound for E of 0).

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A computing device comprising:
an interface configured to interface and communicate with a dispersed or distributed storage network (DSN);
memory that stores operational instructions; and
a processing module operably coupled to the interface and to the memory, wherein the processing module, when operable within the computing device based on the operational instructions, is configured to:
determine, based on a write request of a set of encoded data slices (EDSs) that is monitored via the interface and transmitted via the DSN to a plurality of storage units (SUs) within the DSN, a storage unit (SU) write performance distribution based on storage unit (SU)-based write transfer rates and SU-based write failure rates associated with the write request of the set of EDSs; and
adaptively adjust at least one of a trimmed write threshold number of EDSs or a target width of EDSs for write requests of sets of EDSs that are transmitted via the DSN to the plurality of SUs within the DSN including the write request of the set of EDSs that is transmitted via the DSN to the plurality of SUs within the DSN based on favorable or unfavorable comparison of the SU write performance distribution to an acceptable SU write performance distribution.

2. The computing device of claim 1, wherein the processing module, when operable within the computing device based on the operational instructions, is further configured to:
monitor, via the interface, SU-based write transfer rates and SU-based write failure rates associated respectively with each of the plurality of SUs for the write request of the set of EDSs that is transmitted via the DSN to the plurality of SUs within the DSN, wherein a data object is segmented into a plurality of data segments, wherein a data segment of the plurality of data segments is dispersed error encoded in accordance with dispersed error encoding parameters to produce the set of EDSs that is of pillar width, wherein a decode threshold number of EDSs are needed to recover the data segment, wherein a read threshold number of EDSs provides for reconstruction of the data segment, wherein a write threshold number of EDSs provides for a successful transfer of the set of EDSs from a first at least one location in the DSN to a second at least one location in the DSN; and
generate and maintain the SU write performance distribution based on monitoring, via the interface, of the SU-based write transfer rates and the SU-based write failure rates associated with the write request of the set of EDSs that is transmitted via the DSN to the plurality of SUs within the DSN.

3. The computing device of claim 2, wherein the processing module, when operable within the computing device based on the operational instructions, is further configured to:
adaptively adjust the trimmed write threshold number of EDSs to be below the write threshold number of EDSs and greater than or equal to the decode threshold number of EDSs when the SU write performance distribution compares unfavorably to the acceptable SU write performance distribution; and
adaptively adjust the trimmed write threshold number of EDSs to be same as the write threshold number of EDSs when the SU write performance distribution compares favorably to the acceptable SU write performance distribution.

4. The computing device of claim 3, wherein the processing module, when operable within the computing device based on the operational instructions, is further configured to:
adaptively adjust the trimmed write threshold number of EDSs to be a first number below the write threshold number of EDSs and greater than or equal to the decode threshold number of EDSs when the SU write performance distribution compares unfavorably to the acceptable SU write performance distribution within a first unfavorable comparison range; and
adaptively adjust the trimmed write threshold number of EDSs to be a second number below the write threshold number of EDSs and greater than or equal to the decode threshold number of EDSs when the SU write performance distribution compares unfavorably to the acceptable SU write performance distribution within a second unfavorable comparison range.

5. The computing device of claim 2, wherein the processing module, when operable within the computing device based on the operational instructions, is further configured to:
adaptively increase the target width of EDSs to be greater than the pillar width to specify a subset number of redundant EDSs to be generated from the set of EDSs to be included in at least one write request of at least one set of EDSs to the plurality of SUs within the DSN when the SU write performance distribution compares unfavorably to the acceptable SU write performance distribution; and
adaptively adjust the target width of EDSs to be same as the pillar width when the SU write performance distribution compares favorably to the acceptable SU write performance distribution.

6. The computing device of claim 5, wherein the processing module, when operable within the computing device based on the operational instructions, is further configured to:
  adaptively increase the target width of EDSs to be greater than the pillar width to specify a first subset number of redundant EDSs to be generated from the set of EDSs to be included in the at least one write request of the at least one set of EDSs to the plurality of SUs within the DSN when the SU write performance distribution compares unfavorably to the acceptable SU write performance distribution within a first unfavorable comparison range; and
  adaptively increase the target width of EDSs to be greater than the pillar width to specify a second subset number of redundant EDSs to be generated from the set of EDSs to be included in the at least one write request of the at least one set of EDSs to the plurality of SUs within the DSN when the SU write performance distribution compares unfavorably to the acceptable SU write performance distribution within a second unfavorable comparison range.

7. The computing device of claim 2, wherein the processing module, when operable within the computing device based on the operational instructions, is further configured to:
  adaptively increase the target width of EDSs to be greater than the pillar width to specify one or more redundant copies of the set of EDSs to be generated from the set of EDSs to be included in at least one write request of at least one set of EDSs to the plurality of SUs within the DSN when the SU write performance distribution compares unfavorably to the acceptable SU write performance distribution; and
  adaptively adjust the target width of EDSs to be same as the pillar width when the SU write performance distribution compares favorably to the acceptable SU write performance distribution.

8. The computing device of claim 1, wherein the processing module, when operable within the computing device based on the operational instructions, is further configured to:
  increase a time interval between write requests of sets of EDSs to the plurality of SUs within the DSN to an extended time interval when the SU write performance distribution compares unfavorably to the acceptable SU write performance distribution over a first period of time; and
  reduce the time interval between write requests of sets of EDSs to the plurality of SUs within the DSN from the extended time interval to another extended time interval or the time interval when the SU write performance distribution compares favorably to the acceptable SU write performance distribution over a second period of time following the first period of time.

9. The computing device of claim 1, wherein:
  the computing device is located at a first premises that is remotely located from at least one SU of the plurality of SUs within the DSN; and
  the computing device includes a SU of the plurality of SUs within the DSN, a wireless smart phone, a laptop, a tablet, a personal computers (PC), a work station, or a video game device.

10. The computing device of claim 1, wherein the DSN includes at least one of a wireless communication system, a wire lined communication system, a non-public intranet system, a public internet system, a local area network (LAN), or a wide area network (WAN).

11. A method for execution by a computing device, the method comprising:
  determining, based on a write request of a set of encoded data slices (EDSs) that is monitored via an interface of the computing device that is configured to interface and communicate with a dispersed or distributed storage network (DSN) and that is transmitted via the DSN to a plurality of storage units (SUs) within the DSN, a storage unit (SU) write performance distribution based on storage unit (SU)-based write transfer rates and SU-based write failure rates associated with the write request of the set of EDSs; and
  adaptively adjusting at least one of a trimmed write threshold number of EDSs or a target width of EDSs for write requests of sets of EDSs that are transmitted via the DSN to the plurality of SUs within the DSN including the write request of the set of EDSs that is transmitted via the DSN to the plurality of SUs within the DSN based on favorable or unfavorable comparison of the SU write performance distribution to an acceptable SU write performance distribution.

12. The method of claim 11 further comprising:
  monitoring, via the interface, SU-based write transfer rates and SU-based write failure rates associated respectively with each of the plurality of SUs for the write request of the set of EDSs that is transmitted via the DSN to the plurality of SUs within the DSN, wherein a data object is segmented into a plurality of data segments, wherein a data segment of the plurality of data segments is dispersed error encoded in accordance with dispersed error encoding parameters to produce the set of EDSs that is of pillar width, wherein a decode threshold number of EDSs are needed to recover the data segment, wherein a read threshold number of EDSs provides for reconstruction of the data segment, wherein a write threshold number of EDSs provides for a successful transfer of the set of EDSs from a first at least one location in the DSN to a second at least one location in the DSN; and
  generating and maintaining the SU write performance distribution based on monitoring, via the interface, of the SU-based write transfer rates and the SU-based write failure rates associated with the write request of the set of EDSs that is transmitted via the DSN to the plurality of SUs within the DSN.

13. The method of claim 12 further comprising:
  adaptively adjusting the trimmed write threshold number of EDSs to be below the write threshold number of EDSs and greater than or equal to the decode threshold number of EDSs when the SU write performance distribution compares unfavorably to the acceptable SU write performance distribution; and
  adaptively adjusting the trimmed write threshold number of EDSs to be same as the write threshold number of EDSs when the SU write performance distribution compares favorably to the acceptable SU write performance distribution.

14. The method of claim 13 further comprising:
  adaptively adjusting the trimmed write threshold number of EDSs to be a first number below the write threshold number of EDSs and greater than or equal to the decode threshold number of EDSs when the SU write performance distribution compares unfavorably to the acceptable SU write performance distribution within a first unfavorable comparison range; and adaptively adjusting the trimmed write threshold number of EDSs to be a second number below the write threshold number of EDSs and greater than or equal to the decode threshold number of EDSs when the SU write performance distribution compares unfavorably to the acceptable SU write performance distribution within a second unfavorable comparison range.

15. The method of claim 12 further comprising:
adaptively increasing the target width of EDSs to be greater than the pillar width to specify a subset number of redundant EDSs to be generated from the set of EDSs to be included in at least one write request of at least one set of EDSs to the plurality of SUs within the DSN when the SU write performance distribution compares unfavorably to the acceptable SU write performance distribution; and
adaptively adjusting the target width of EDSs to be same as the pillar width when the SU write performance distribution compares favorably to the acceptable SU write performance distribution.

16. The method of claim 15 further comprising:
adaptively increasing the target width of EDSs to be greater than the pillar width to specify a first subset number of redundant EDSs to be generated from the set of EDSs to be included in the at least one write request of the at least one set of EDSs to the plurality of SUs within the DSN when the SU write performance distribution compares unfavorably to the acceptable SU write performance distribution within a first unfavorable comparison range; and
adaptively increasing the target width of EDSs to be greater than the pillar width to specify a second subset number of redundant EDSs to be generated from the set of EDSs to be included in the at least one write request of the at least one set of EDSs to the plurality of SUs within the DSN when the SU write performance distribution compares unfavorably to the acceptable SU write performance distribution within a second unfavorable comparison range.

17. The method of claim 12 further comprising:
adaptively increasing the target width of EDSs to be greater than the pillar width to specify one or more redundant copies of the set of EDSs to be generated from the set of EDSs to be included in at least one write request of at least one set of EDSs to the plurality of SUs within the DSN when the SU write performance distribution compares unfavorably to the acceptable SU write performance distribution; and
adaptively adjusting the target width of EDSs to be same as the pillar width when the SU write performance distribution compares favorably to the acceptable SU write performance distribution.

18. The method of claim 11 further comprising:
increasing a time interval between write requests of sets of EDSs to the plurality of SUs within the DSN to an extended time interval when the SU write performance distribution compares unfavorably to the acceptable SU write performance distribution over a first period of time; and
reducing the time interval between write requests of sets of EDSs to the plurality of SUs within the DSN from the extended time interval to another extended time interval or the time interval when the SU write performance distribution compares favorably to the acceptable SU write performance distribution over a second period of time following the first period of time.

19. The method of claim 11, wherein:
the computing device is located at a first premises that is remotely located from at least one SU of the plurality of SUs within the DSN; and
the computing device includes a SU of the plurality of SUs within the DSN, a wireless smart phone, a laptop, a tablet, a personal computers (PC), a work station, or a video game device.

20. The method of claim 11, wherein the DSN includes at least one of a wireless communication system, a wire lined communication system, a non-public intranet system, a public internet system, a local area network (LAN), or a wide area network (WAN).

* * * * *